United States Patent [19]

Fukunaga et al.

[11] 4,374,603

[45] Feb. 22, 1983

[54] ELECTRIC CONNECTOR FOR FLAT CABLE

[75] Inventors: Yukio Fukunaga; Hiroshi Tsuda, both of Yokohama, Japan

[73] Assignee: Nissan Motor Co., Ltd., Yokohama, Japan

[21] Appl. No.: 241,084

[22] Filed: Mar. 6, 1981

[30] Foreign Application Priority Data

Mar. 10, 1980 [JP] Japan .................................. 55-29256

[51] Int. Cl.³ ............................................. H01R 9/07
[52] U.S. Cl. ................................. 339/17 F; 339/64 M; 339/176 MF
[58] Field of Search ............ 339/17 F, 176 MF, 64 R, 339/64 M

[56] References Cited

U.S. PATENT DOCUMENTS 3,102,767 9/1963 Schneck ...................... 339/176 MF
3,614,707 10/1971 Kaufmann et al. .......... 339/176 MF
4,241,968 12/1980 Fukunaga ...................... 339/64 M

FOREIGN PATENT DOCUMENTS 2024126 11/1971 Fed. Rep. of Germany .
2218721 10/1973 Fed. Rep. of Germany .
2924337 1/1980 Fed. Rep. of Germany .

Primary Examiner—John McQuade

[57] ABSTRACT

In an electric connector which comprises a plug having a plurality of terminal elements in a housing; a socket having a recess to receive the head portion of the plug, and a printed wiring sheet attached to the socket in such a manner that a plurality of exposed foil terminals of the sheet are enfolded into the recess; and an equalizing float accommodated in the recess of the socket with clearance for floating sideways movement therewithin and having an opening with an inside dimension matching the head portion of the plug, the head portion of the plug being snugly inserted into the opening of the float, upon coupling of the plug with the socket, in a manner such that the exposed foil terminals are grippingly held between the mating sections of the plug terminal elements and the inner surface of the float, the exposed foil terminals of the sheet are formed at the base sections thereof with plastically deformable corrugated portions.

3 Claims, 2 Drawing Figures

ELECTRIC CONNECTOR FOR FLAT CABLE

BACKGROUND OF THE INVENTION

The present invention relates in general to an electric connector for electrically connecting an electric device with another electric device, and more particularly to an electric connector which is constructed to assure well balanced contacts between the plug-mounted terminals and the socket-mounted terminals. More specifically, the present invention is concerned with an electric connector, of the type mentioned above, which is particularly employable in a motor vehicle instrument panel.

SUMMARY OF THE INVENTION

It is an object of the present invention to provide an electric connector which is constructed to assure well-balanced contacts between the plug-mounted terminals and the socket-mounted terminals even when the plug and the socket are misaligned.

According to the present invention, there is provided an electric connector which comprises an insulating housing and a plurality of terminal elements in the housing, each of the terminal elements having at its one end a mating section which is exposed from a head portion of the housing; a socket including a body having a recess to receive the head portion of the plug, and a printed wiring sheet attached to the body in a manner such that a plurality of exposed foil terminals of the sheet are enfolded into the recess; and an equalizing float accommodated within the recess of the socket with clearance for floating sideways movement therewithin and having an opening with an inside dimension matching the head portion of the housing, the head portion of the plug being snugly inserted into the opening of the float, upon coupling of the plug with the socket, in a manner such that the exposed foil terminals are grippingly held between the mating sections of the plug and the inner surface of the float, wherein the exposed foil terminals of the sheet are formed at the base sections thereof with plastically deformable corrugated portions.

BRIEF DESCRIPTION OF THE DRAWINGS

Other objects and advantages of the present invention will become clear from the following description when taken in conjunction with the accompanying drawings, in which.

DESCRIPTION OF THE PRESENT INVENTION

Figure 1:
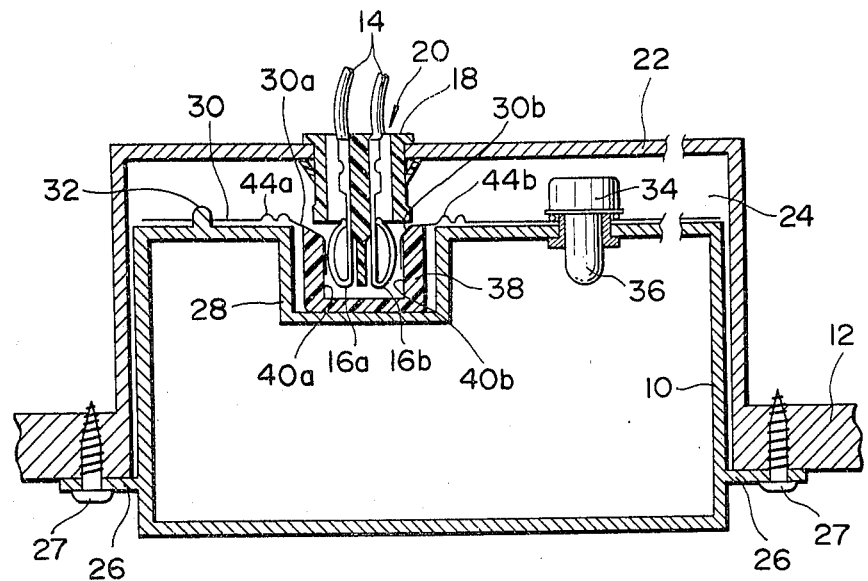
FIG. 1 is a sectional view of an electric connector of the present invention, as being employed in a vehicular instrument panel.
Figure 2:
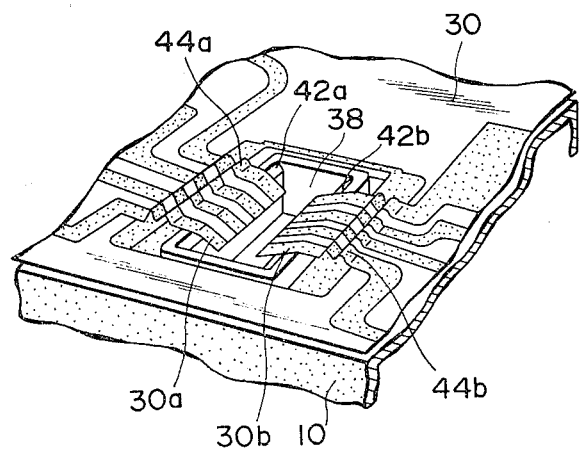
FIG. 2 is a partial perspective view of an electric instrument assembly at a its rear portion where a socket member is provided.

Referring to FIGS. 1 and 2, especially FIG. 1, there is shown an electric connector according to the present invention, which is employed for electrically connecting an electric instrument 10, mounted to a vehicular instrument panel 12, with connecting wires 14 which extend from a known electric device such as a junction block (not shown). The wires 14 are connected to terminal elements 16a and 16b which are accommodated in an insulating housing 18 to constitute a plug or male mating member 20. The plug 20 is removably fixed to a bottom wall 22 of a pocket 24 of the instrument panel 12 in a manner so as to project at its head into the pocket 24.

The electric instrument 10 has a contour matching with the pocket 24 of the instrument panel 12 and has at its both sides mounting lugs 26. The instrument 10 is disposed in the pocket 24 with the lugs 26 connected by bolts 27 to the instrument panel 12 as shown. As will become clear as the description proceeds, usually, mounting the instrument 10 to the pocket 24 is made prior to fixing the plug 20 to the bottom wall 22 of the pocket 24.

The electric instrument 10 is provided at its rear side a socket or receptacle 28 into which the head of the plug 20 is inserted completing electric connection between the plug 20 and the instrument 10 upon fixing of the plug member 20 to the bottom wall 22 of the pocket 24. The instrument 10 has a printed wiring sheet 30 affixed to the rear side thereof. The sheet 30 is flexible and composed of an insulating base-film, and an insulating overlay film and a printed wiring of conductive foil (made of copper, aluminium or the like) which is interposed between the base film and the overlay film. The overlay film is partially removed at a portion where the socket 28 is positioned, thereby exposing the foil to provide two opposed foil terminal groups 30a and 30b. The location of the sheet 30 with respect to the rear side of the electric instrument 10 is assured by a projection 32 formed on the rear side. Designated by numeral 34 is a socket 34 for a light bulb 36, which is mounted to the rear side of the instrument 10 and electrically connected to selected conductive foils of the sheet 30.

A box-like equalizing float 38 is sidewards movably received in the socket 28. The equalizing float 38 consists of a box-like insulating frame which has an inside dimension matching for the head of the plug 20 and which is floatingly movable sidewards, for instance, within the socket 28 of the electric instrument 10. As will be seen from FIG. 2, the two foil terminal groups 30a and 30b are slightly enfolded into the opening of the float 38 which rests in the socket 28. As will become apparent as the description proceeds, the inner opposed side surfaces 40a and 40b of the float 38 serve as a support for the foil terminal groups 30a and 30b upon coupling of the plug 20 with the socket 28. The inner front edges 42a and 42b (see FIG. 2) of the opposed side surfaces 40a and 40b are rounded off.

According to the present invention, a measure is further employed in which each of the foil terminal groups 30a and 30b is formed at its base section with a corrugated portion 44a or 44b. The corrugated portion 44a or 44b is located at a portion of the terminal group other than the portion which is brought into contact with the mating sections of the terminal elements 16a and 26b of the plug 20, as will be seen from FIG. 1. The corrugated portion 44a or 44b is so formed that upon application of a certain force to pull the terminal group, the corrugated portion 44a or 44b yields to plastic deformation permitting axial elongation of the terminal group 42a or 42b. For forming such corrugated portions 44a and 44b on the printed wiring sheet 30, conventional sheet pressing method or conventional sheet rolling method is used.

The electric connection between the plug 20 and the socket 28, more particularly between the terminal elements 16 of the plug 20 and the terminal groups 30a and 30b of the sheet 30 on the instrument 10 is made as follows:

Prior to fixing of the plug 20 to the bottom wall 22 of the pocket 24, the instrument 10 is tightly disposed in the pocket 24 with the mounting lugs 26 bolted to the instrument panel 12. When fixing the plug 20 to the bottom wall 22, the head of the plug 20 is inserted into the equalizing float 38 bringing the terminal elements 16a and 16b of the plug 20 into contact with the exposed foil terminals of the terminal groups 30a and 30b of the printed wiring sheet 30 by the aid of the inner opposed side surfaces 40a and 40b of the float 38 which serve as a support for the terminal groups 30a and 30b. During the insertion of the head of the plug 20 into the equalizing float 38, the float 38 is sidewards moved to a position where the contact pressure exerted between the terminal elements 16a of the plug 20 and the foil terminals of the terminal group 30a and the contact pressure exerted between the terminal elements 16b of the plug 20 and the other foil terminals of the terminal group 30b are equalized. As is known in the art, well balanced contact between contacting elements and contacted elements is essentially necessary for providing well balanced electrical connection.

When, now, there arises a considerable misalignment between the instrument 10 and the pocket 10 of the instrument panel 12 caused by looseness of the bolts 27 caused by mechanical shocks applied thereto under cruising of the vehicle, relative displacement between the plug 20 and the socket 28 occurs maintaining the contacting engagement between the terminal elements 16a and 16b and the exposed foil terminals groups 30a and 30b, thereby stretching one of the terminal groups 30a and 30b and simultaneously shrinking the other of the terminal groups 30a and 30b. Now, it should be noted that the provision of the corrugated portions 44a and 44b absorbs this relative displacement by plastically deforming them. This phenomenon is quite advantageous when considering the matter in that when such corrugated portions are not provided, the relative displacement between the plug 20 and the socket 28 will cause breakage of the exposed foil terminals 30a or 30b or appearance of unsightly creases on the same.

With the above, it will be appreciated that, according to the present invention, well-balanced contact between the plug terminal elements and the socket foil terminals is maintained even when the socket 28 is brought into misalignment with the plug 20 during usage of the connector.

What is claimed is:

1. An electric connector comprising:
    a plug including an insulating housing and a plurality of terminal elements in said housing, each of said terminal elements having at its one end a mating section which is exposed from a head portion of said housing;
    a socket including a body having a recess to receive said head portion of the plug, and a printed wiring sheet attached to said body in a manner such that a plurality of exposed foil terminals of said sheet are enfolded in said recess; and
    an equalizing float accommodated within said recess of said socket with clearance for floating sideways movement therewithin and having an opening with an inside dimension matching with said head portion of said housing, said head portion being snugly inserted into said opening of said float, upon coupling of said plug with said socket, in a manner such that the exposed foil terminals are grippingly held between the mating sections of said plug and the inner surface of said float,
    wherein said exposed foil terminals of said sheet are formed at the base sections thereof with plastically deformable corrugated portions.

2. An electric connector as claimed in claim 1, in which said plastically deformable corrugated portions are located at portions of the foil terminals other than the portions of the same which are brought into contact with the mating sections of the plug terminal elements upon coupling of said plug with said socket.

3. An electric connector as claimed in claim 2, in which said equalizing float is rounded off along the inner front edges of the inner opposed side surfaces thereof.

* * * * *